US006975895B1

(12) United States Patent
Pelc et al.

(10) Patent No.: US 6,975,895 B1
(45) Date of Patent: Dec. 13, 2005

(54) MODIFIED X-RAY TUBE FOR USE IN THE PRESENCE OF MAGNETIC FIELDS

(75) Inventors: Norbert J. Pelc, Los Altos, CA (US); Rebecca Fahrig, Palo Alto, CA (US); Marcus T. Alley, Palo Alto, CA (US); Zhifei Wen, Mountain View, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 591 days.

(21) Appl. No.: 09/823,889

(22) Filed: Mar. 30, 2001

Related U.S. Application Data

(60) Provisional application No. 60/193,731, filed on Mar. 30, 2000, and provisional application No. 60/193,735, filed on Mar. 30, 2000.

(51) Int. Cl.[7] ............................ H01J 35/30; A61B 5/05

(52) U.S. Cl. ........................................ 600/411; 378/137

(58) Field of Search ................................ 600/411, 410, 600/407, 412, 414, 312, 321, 317, 329, 309; 324/307, 308, 309; 378/137, 113, 62, 20, 138, 63

(56) References Cited

U.S. PATENT DOCUMENTS

| | | | | | |
|---|---|---|---|---|---|
| 4,455,277 | A | * | 6/1984 | Schlitt | 376/103 |
| 5,077,774 | A | * | 12/1991 | Piestrup et al. | 378/119 |
| 5,125,019 | A | | 6/1992 | Evain et al. | 378/137 |
| 5,369,679 | A | * | 11/1994 | Sliski et al. | 378/65 |
| 5,442,678 | A | * | 8/1995 | Dinsmore et al. | 378/137 |
| 5,528,652 | A | * | 6/1996 | Smith et al. | 378/65 |
| 5,550,889 | A | | 8/1996 | Gard et al. | 378/113 |
| 5,563,407 | A | | 10/1996 | Yamagishi | 250/214 |
| 5,713,357 | A | * | 2/1998 | Meulenbrugge et al. | 600/411 |
| 5,818,901 | A | * | 10/1998 | Schulz | 378/63 |
| 6,031,888 | A | * | 2/2000 | Ivan et al. | 378/20 |
| 6,055,294 | A | | 4/2000 | Foerst et al. | 378/138 |
| 6,101,239 | A | | 8/2000 | Kawasaki et al. | 378/63 |
| 6,151,384 | A | | 11/2000 | Reed et al. | 378/138 |
| 6,256,371 | B1 | * | 7/2001 | Hasegawa et al. | 378/34 |

OTHER PUBLICATIONS

F, D. Becchetti et al., "Magnetic confinement of radiotherapy beam–dose profiles," Cyclotrons and Their Applications 2001, Sixteenth International Conference (AIP Press) pp. 44–46.

Dale W Litzenberg et al., "An apparatus for applying strong longitudinal magnetic fields to clinical photon and electron beams," Phys Med Bio V46 No. 5, pp. N105–N115, (2001).

Frederick D. Becchetti et al., "High energy electron beams shaped with applied magnetic fields could provide competitive and cost–effective alternative to proton and heavy–ion radiotherapy," Med Phys 29 (10), Oct. 2002, pp. 2435–2437.

* cited by examiner

*Primary Examiner*—Daniel Robinson
(74) *Attorney, Agent, or Firm*—Lumen Intellectual Property Services, Inc.

(57) ABSTRACT

An imaging system and method combines a magnetic resonance imaging (MRI) system and an x-ray fluoroscopy system such that the two systems have coincident fields of view. X-rays are generated by a stationary anode x-ray tube in which an electron beam is accelerated from a cathode to an anode. In the presence of the static magnetic field of the MRI system, the electron beam is deflected unless it is parallel to the static magnetic field. The x-ray source of the invention contains elements used to steer the electron beam and increase its focusing on the anode. The beam can be steered electrostatically, electromagnetically, or by adding magnetic material to the x-ray source. In the resulting system, MR and x-ray images are acquired without moving the object, which is particularly useful for image-guided medical intervention procedures.

22 Claims, 4 Drawing Sheets

MODIFIED X-RAY TUBE FOR USE IN THE PRESENCE OF MAGNETIC FIELDS

CROSS-REFERENCE TO RELATED APPLICATIONS

This application claims the benefit of U.S. Provisional Application Nos. 60/193,731 and 60/193,735, both filed Mar. 30, 2000, both of which are herein incorporated by reference.

STATEMENT REGARDING FEDERALLY SPONSORED RESEARCH OR DEVELOPMENT

This invention was supported in part by grant number P41 RR09784 from the National Institutes of Health (NIH). The U.S. Government has certain rights in the invention.

FIELD OF THE INVENTION

This invention relates generally to medical systems and methods for visualizing the human body and medical interventional devices. More particularly, it relates to an apparatus combining magnetic resonance imaging (MRI) and x-ray imaging in the same location using a modified x-ray tube.

BACKGROUND ART

Magnetic resonance imaging (MRI) and x-ray fluoroscopic imaging are important medical visualization tools used for image-guided interventional procedures. Each method provides its own advantages: MRI provides excellent soft tissue contrast, three-dimensional visualization, physiological information, and the ability to image in any scan plane, while x-ray imaging offers much higher spatial and temporal resolution in a projection format, useful for visualization and placement of guidewires, catheters, stents, and other medical devices. Combining the two imaging systems therefore offers significant benefits over using each system alone. Currently, several approaches are used for combining the systems. In one, an x-ray fluoroscope is located in a room adjacent to the MRI system. In another, the x-ray and MRI systems are in the same room, but the patient must be moved out of the magnetic field to be imaged by the x-ray system. Moving the patient is undesirable, because it is time consuming, possibly dangerous, and can render the images inconsistent. Therefore, one wants to minimize the distance between the two systems, and perhaps overlap them. This will place critical components of the x-ray system within a high magnetic field.

The ideal system is one in which x-ray imaging and magnetic resonance imaging can be performed in the same location, eliminating the need to move the patient. Before a combined MRI and x-ray system can be constructed, however, the individual systems must be modified to ensure that the high magnetic field of the MRI system does not affect the x-ray system, and that the x-ray system does not disturb the operation of the MRI system. For example, conventional x-ray fluoroscopy detectors are image intensifiers, which are exceedingly sensitive to magnetic fields and therefore cannot be used near, let alone inside, an MRI system. However, flat panel x-ray detectors that are relatively immune to magnetic field effects are now available.

A major obstacle to combining MRI and x-ray systems is the x-ray source, which consists of an x-ray tube and its housing. X-rays are generated using an x-ray tube, in which electrons are accelerated from a heated cathode to an anode by a very high potential (e.g., 150 kV). Interactions between the high energy electrons of the beam and atoms of the anode target material cause deceleration of the electrons and production of x-ray photons.

FIG. 1 is a schematic diagram of an x-ray tube 10 of the prior art. The tube 10 is evacuated and contains a tungsten filament cathode 12 and a more massive anode 14, typically a copper block 16 with a metal target 18 plated on or embedded in the copper surface. The target 18 is most often tungsten, but other metals can be used, such as chromium, copper, molybdenum, rhodium, silver, iron, or cobalt. Separate circuits are used to heat the filament 12 and to accelerate the electrons to the target 18. The accelerating potential determines the spectrum of wavelengths (or photon energies) of the emitted x-rays. A high voltage is connected between the cathode 12 and anode 18 to provide the accelerating potential. Typically, the anode and cathode voltages are plus and minus half of the accelerating voltage, respectively. X-rays generated at the target 18 exit the tube 10 through an x-ray transparent window 20 and are directed toward the object being imaged.

When an x-ray tube is operated within or near an MRI system, it experiences the static magnetic field $B_o$, as illustrated schematically in FIG. 2. The magnetic field at the location of the x-ray tube exerts a force on the electrons and may deflect or defocus the electron beam. The force on an electron is proportional to the cross-product of the velocity of the electron and the magnetic field; that is, only the velocity component that is perpendicular to the magnetic field is perturbed. This will alter the direction of the electron motion, thereby making the direction of the deflecting force time-dependent. In the example of FIG. 2, the macroscopic result of the time-dependent force is to produce an electron beam in the direction of $B_0$, with an additional deflection of the beam $v_{\perp drift}$ in a direction perpendicular to both $B_0$ and the electric field E. Because the ideal electron velocity is in the direction of the target, as is the acceleration caused by the electric field, unless the magnetic field is parallel to the electron beam, it always deflects the electrons away from the center of the target, possibly causing them to miss the target entirely. Thus the effect of the static magnetic field of the MRI system on the x-ray tube can be highly undesirable and may damage the tube if it is operated under non-ideal conditions, or it may lower the x-ray intensity to a level that is unacceptable. In the combined system, it is not desirable—indeed it may be impossible—to turn off the static magnetic field before acquiring x-ray images, and so the effect of the magnetic field on the x-ray tube must be addressed.

A number of combined magnetic resonance imaging and x-ray imaging systems are disclosed in the prior art. U.S. Pat. No. 5,713,357, issued to Meulenbrugge et al., discloses a combined system that minimizes or eliminates the distance an object being imaged must be displaced between the individual systems. In one embodiment, the object is displaced a small distance along a track between adjacent MRI and x-ray imaging systems with non-coincident fields of view. In another embodiment, the object is not moved and the fields of view of the two systems are coincident, but the x-ray imaging system is moved out of the MRI field of view during MR image acquisition. During x-ray imaging, the x-ray source is either out of range of the static magnetic field, passively shielded from the magnetic field, or positioned so that the electron beam is parallel to the magnetic field. In this alignment, the electron beam should not be deflected by the magnetic field.

U.S. Pat. No. 5,818,901, issued to Shulz, discloses a combined system with simultaneous MR and x-ray imaging and coincident fields of view. A solid state x-ray detector containing amorphous hydrated silicon, which is not affected by the magnetic field, is used in place of an image intensifier. The x-ray source is positioned far enough from the MR apparatus that the influence of the magnetic field on the x-ray source is slight. Additionally, the influence is reduced further by surrounding the source with a cladding material that shields the source from the magnetic field. The goal of the cladding or shielding is to reduce the magnetic field at the location of the x-ray source to a level where it can be tolerated.

U.S. Pat. No. 6,031,888, issued to Ivan et al., discloses an x-ray fluoroscopy assist feature for a diagnostic imaging device such as MRI or computerized tomography (CT). X-rays are generated using a rotating anode x-ray tube. There is no mention of the effects of the magnetic field on the x-ray source or of any methods to eliminate such effects.

A medical imaging apparatus containing both x-ray radiographic means and MRI means is disclosed in U.S. Pat. No. 6,101,239, issued to Kawasaki et al. The x-ray and MRI systems have coincident fields of view, and the timing of the image acquisition is controlled so that the x-ray pulses occur only when the gradient magnetic fields and RF magnetic fields fields of the MRI system are off. There is no mention of minimizing or eliminating the effect of the static magnetic field on the x-ray source.

These prior art references offer two solutions to the problem of electron beam deflection in the x-ray tube by the static magnetic field of the MRI system: shielding the tube or aligning the electron beam with the magnetic field. Sufficient cladding to completely eliminate the effect of the magnetic field on the electron beam may not be feasible. Aligning the tube with the field also has potential problems. First, the alignment may be very critical, i.e., have a very small tolerance, making it difficult to attain. Second, x-ray tube inserts typically have components that distort the magnetic field and pose additional difficulties that cannot be solved simply by aligning the electron beam with the magnetic field. The alignment also constrains the image plane, potentially to undesired orientations. Thus it would be advantageous to provide a more robust method for eliminating the effect of the static magnetic field of the MRI system on the electron beam of the x-ray tube.

SUMMARY

Accordingly, the present invention provides a combined MRI and x-ray fluoroscopy system using a modified x-ray source that improves the control of the direction of the electron beam onto the x-ray tube target. Deflection of the electron beam by the static magnetic field is reduced or eliminated. The present invention also provides a modified x-ray tube for use in a magnetic field. The modified x-ray tube contains various additions for steering the electron beam onto the anode target, and therefore has an increased robustness to magnetic fields in comparison with conventional x-ray tubes.

Specifically, the present invention provides an imaging system containing a magnetic resonance imaging (MRI) system and an x-ray fluoroscopy system, each having a respective field of view (FOV). Ideally, the MRI and x-ray fields of view are substantially coincident, so that an object being imaged does not need to be moved to acquire both types of image, but this need not be the case. Preferably, the MRI system is an interventional MRI system, and the x-ray system is positioned within an open bore of the MRI system. The MRI system contains a magnet for generating a static magnetic field. The x-ray system contains an x-ray source having an x-ray tube for generating x-rays by accelerating an electron beam onto an anode target. The x-ray tube is in the presence of the static magnetic field. A stationary anode x-ray tube is preferred due to its more compact size, but a rotating anode tube can also be used. The x-ray source also contains means for steering the electron beam onto the anode target. Preferably, the x-ray tube is positioned so that the electron beam is substantially parallel to the static magnetic field, minimizing the amount of beam steering required to steer the electron beam onto the target. Ideally, the x-ray system also has mostly non-magnetic components and therefore does not significantly distort the static magnetic field of the MRI system.

Preferably, the system contains a feedback system in communication with the steering means. The feedback system detects the location of the electron beam focal spot on the anode target and determines the amount of steering required to adjust the focal spot to its standard position, i.e., when not in a magnetic field. The detection component of the system can be, for example, a digital imager, a monitoring array for measuring the x-ray emission profile of the anode target, perpendicular slits surrounding the electron beam to measure the current flowing through the slits, or an infrared sensor for measuring the heat distribution of the anode.

In one embodiment, the steering means are electrostatic plates for electrostatically deflecting the electron beam toward the anode target. Alternatively, one or more electromagnets, each in the form of a wire coil, is positioned around the x-ray tube for electromagnetically deflecting the electron beam toward the target. In a third embodiment, a magnetic material is positioned behind the anode target, i.e., opposite the electron beam, to distort the magnetic field within the tube and focus the electron beam onto the target. A magnetic material is formed into an envelope (e.g., a tube) and positioned around the x-ray tube in a fourth embodiment, again to alter the direction of the external magnetic field and thereby steer the electron beam onto the target.

The present invention also provides an imaging method containing two main steps: acquiring a magnetic resonance image of an object; and acquiring an x-ray fluoroscopic image of the same object, with minimal or no motion of the object between acquisitions. To acquire the x-ray image, x-rays are generated by accelerating electrons between a cathode and an anode of an x-ray tube, the x-ray tube being placed in a magnetic field and the tube constructed so as to steer the electron beam onto the anode. Increased focusing and steering is performed according to four embodiments: electrostatically deflecting the electron beam using electrostatic plates, electromagnetically deflecting the electron beam using an electromagnet around the x-ray tube, positioning a magnetic material behind the anode, and positioning an envelope of magnetic material around the x-ray tube.

The different embodiments of the invention all allow for some control of the steering or aiming of the electron beam in the x-ray tube without requiring careful alignment of the x-ray tube with the static magnetic field of the MRI system. As a result, the x-ray tube can be placed within the main magnetic field of the MRI system.

DETAILED DESCRIPTION

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

The present invention provides a combined magnetic resonance imaging (MRI) and x-ray to fluoroscopic imaging apparatus and method. Ideally, the two imaging systems have substantially coincident fields of view (FOV). This allows both types of images to be acquired without moving the object being imaged (e.g., a patient). The invention is particularly advantageous for image-guided interventional procedures, in which x-ray imaging guides placement of guidewires, catheters, or stents, while MR imaging provides soft tissue contrast. Conventional individual systems are modified according to the invention in order to reduce the effect of each system on each other, thereby enabling high quality images to be acquired.

The present invention also provides a modified x-ray tube for use in an external magnetic field. The x-ray tube contains one of a variety of inventive devices for steering the electron beam toward the anode target of the tube. As a result, deflection of the electron beam by the external magnetic field is minimized.

Figure 3:
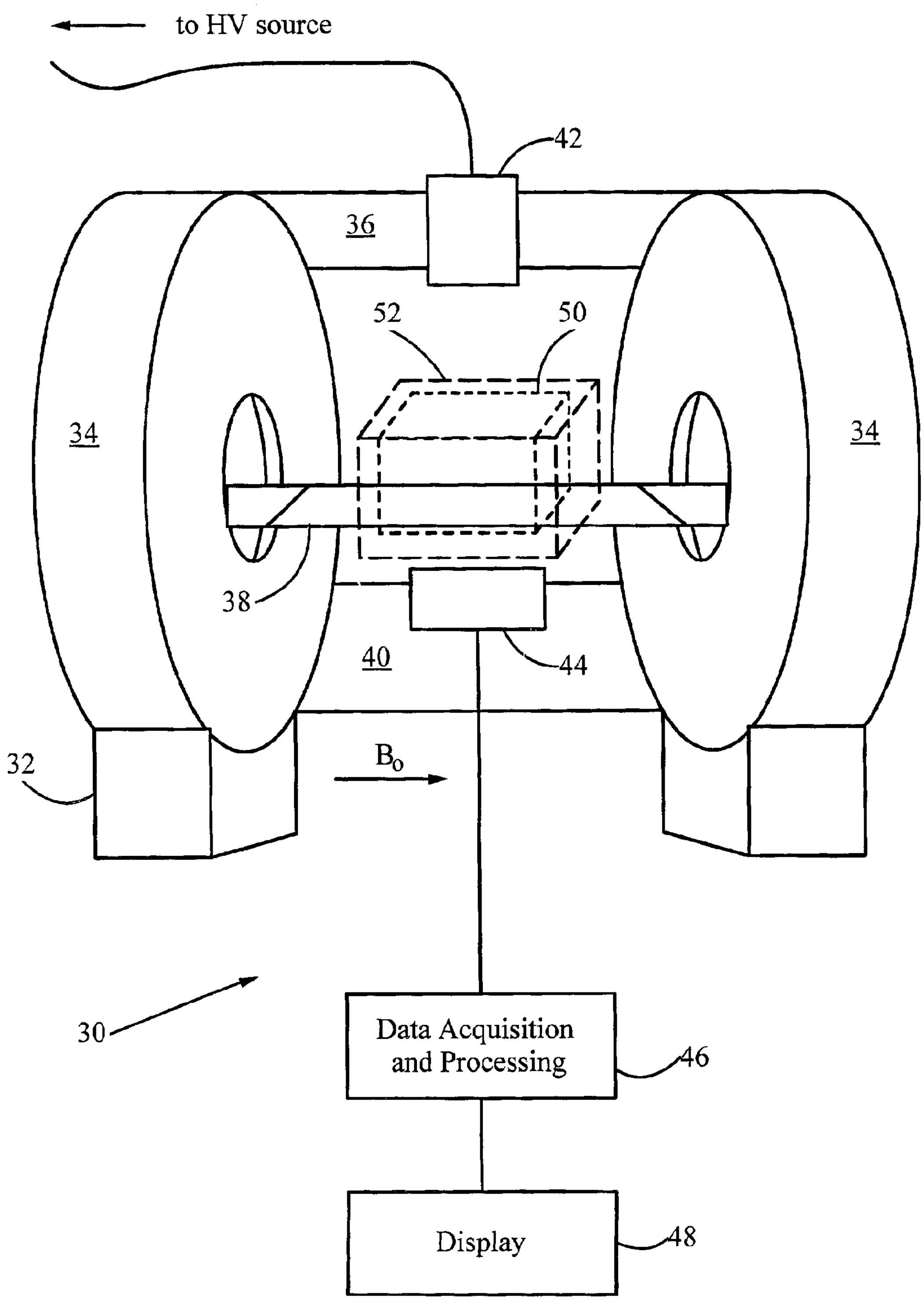
FIG. 3 is a schematic diagram of an imaging apparatus of the present invention.

FIG. 3 is a schematic diagram of an imaging apparatus 30 according to the present invention. As shown, the apparatus 30 contains a standard open-bore double-donut interventional MRI unit 32 containing magnets 34, an upper horizontal enclosure 36, a patient support 38, and a bridge 40 below the patient support 38. The magnets 34 provide a static or main magnetic field $B_0$ in the direction of the arrow. Not shown are standard additional elements such as gradient coils, gradient amplifiers, radio frequency (RF) coils, RF transmitters, data acquisition and processing electronics, and a display. Added to MRI unit 32 are the elements of an x-ray fluoroscopy system: an x-ray source 42, a high voltage generator (not shown), an x-ray detector 44, a detector power supply (not shown), data acquisition and processing electronics 46, and a display 48. The x-ray source 42 is contained within the upper horizontal enclosure 36, and the x-ray detector 44 is positioned in the bridge 40 below the patient support 38. This positioning provides adequate distances between the x-ray source 42 and the object and between the source 42 and the x-ray detector 44; for example, in a commercial interventional device, the distances are 75 cm and 90 cm, respectively. The patient support 38 is transparent to x-rays.

The orientation of the x-ray system components shown in FIG. 3 provides x-ray imaging in a vertical projection. The x-ray field of view (FOV) is shown by the dotted lined box designated by the reference character 50. X-ray images can be acquired of objects within the x-ray FOV 50. Similarly, the MRI field of view is shown by the dotted lined box designated by the reference character 52. MR images can be acquired of objects within the MRI FOV 52. The two fields of view are referred to herein as substantially coincident when their intersection contains a majority of at least one of the two fields of view. Alternatively, the FOVs can be thought of as substantially coincident when a region of interest of an imaged object can be imaged by both systems without moving the object. Of course, it is not necessary that the x-ray components be positioned as shown in FIG. 3 to provide coincident fields of view. Any suitable positioning of the x-ray components to provide coincident fields of view is within the scope of the present invention. For example, it may be desired to acquire x-ray images at different projections, in which case the x-ray source 42 and x-ray detector 44 are mounted on a rotatable support. The invention can also be implemented with a closed bore MRI system, with the x-ray components situated appropriately.

Further, although coincident fields of view is highly desirable, the present invention can be practiced with systems in which the fields of view are not coincident. In fact, when the x-ray tube is not within the bore of the MRI system, the magnetic field is much less controlled than it is within the bore. In this case, it is very difficult to align the electron beam with the magnetic field, and the present invention is particularly useful.

Preferably, the individual modalities (i.e. MRI and x-ray) of the apparatus 30 are not active simultaneously, i.e., MR images and x-ray images are not acquired simultaneously, to minimize the detrimental effect of each system on the other. RF interference by the x-ray system on the MRI system is minimized by powering down the x-ray system before acquiring MR images. When x-ray images are acquired, only the main magnetic field of the MRI system is present; other elements, such as the magnetic field gradients and RF magnetic fields, are inactive.

Figure 1:
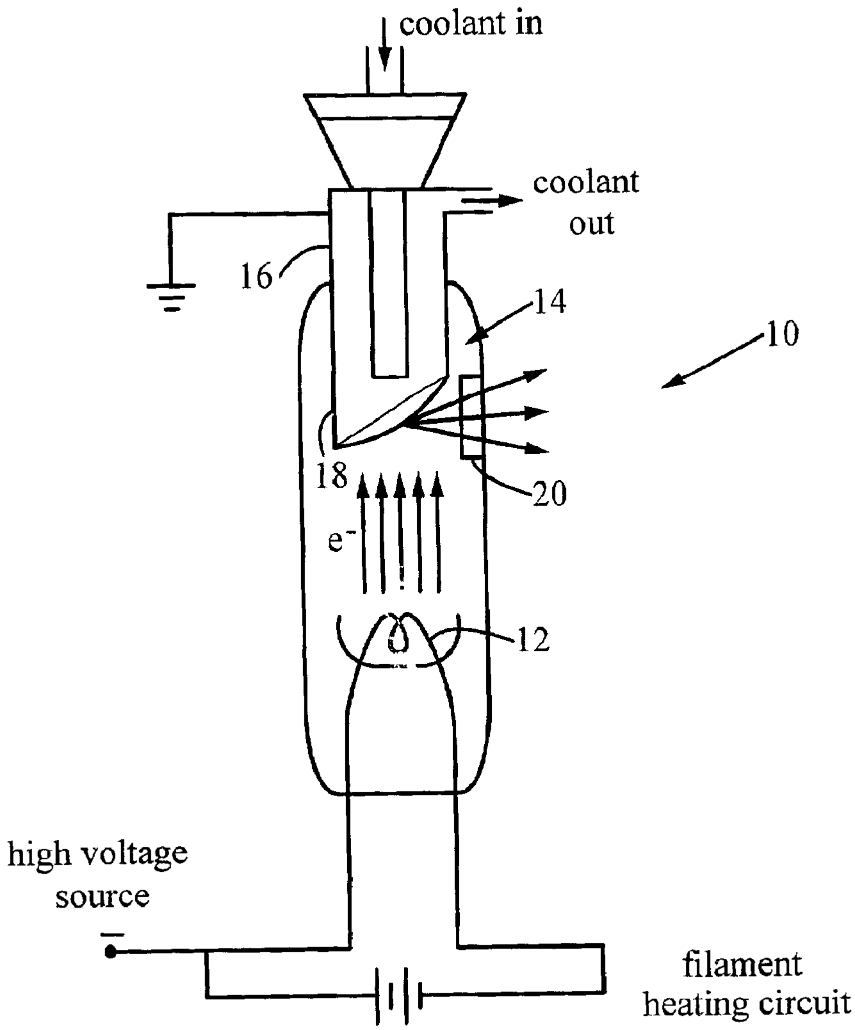
FIG. 1 is a schematic diagram of an x-ray tube of the prior art.
Figure 2:
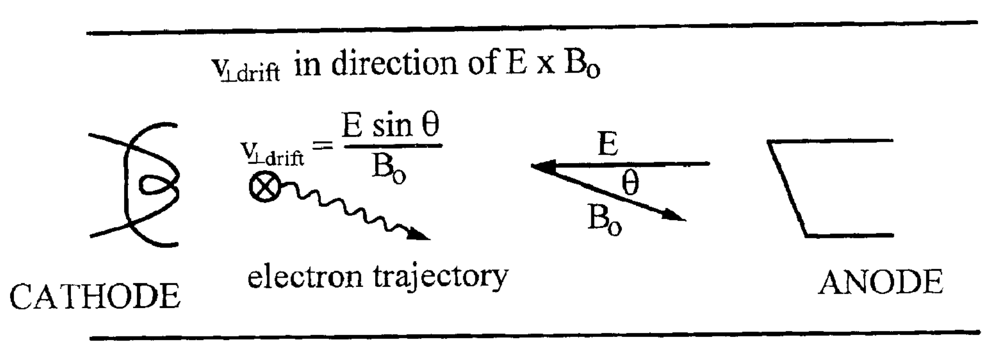
FIG. 2 is a schematic diagram showing the deflection of an electron beam in a magnetic field, as known in the prior art.

Note that only the x-ray source 42 and x-ray detector 44 must be placed in the static magnetic field. The high voltage power supply and its control (often referred to as the x-ray generator) and the data acquisition and processing electronics 46 and display 48 are preferably located outside of the static magnetic field and connected to the source and detector by copper cables shielded by a grounded surface (both non-magnetic). The high voltage source provides both the accelerating voltage between the cathode and anode and the AC current for heating the cathode filament (see FIG. 1). In systems with a fragile x-ray tube filament, heating the filament with AC power can cause it to break in a magnetic field from mechanical vibration. If desired, the filament power supply in the generator can be modified to rectify the filament power. However, in experiments performed by the present inventors, rectifying the power was unnecessary in at least one tube.

The x-ray detector 44 is preferably a solid state flat panel detector containing a phosphor conversion layer such as CsI coupled to an amorphous silicon panel having an array of photodiodes and readout electronics. The phosphor layer converts x-ray radiation into visible light, and the photodetectors generate electric signals from the visible light. Such detectors are commercially available. An alternative choice is a flat panel detector coupled to a so-called "direct conversion" photoconducting layer such as amorphous selenium. Charge carriers produced by the x-rays in the photoconductor are swept by an electric field across the converter and read out by the pixel electronics in the flat panel detector. Detectors using CCD devices can also be used.

The x-ray source 42 contains an x-ray tube, a collimator, and a housing. The x-ray tube is preferably a stationary anode x-ray tube. Most x-ray tubes in diagnostic x-ray imaging systems have rotating anodes, which allow high exposure rates without target vaporization. Induction motors used to spin the anode may be significantly affected by the external field, and may distort the magnetic field of the MRI system. Fixed anode tubes provide lower, but still sufficient, intensity, particularly for long, low-dose fluoroscopic exposures, and are compatible with the magnetic field. Magnetic components within a standard x-ray tube are replaced with equivalent non-magnetic components, e.g., stainless steel components. The x-ray source housing is typically aluminum, a non-magnetic material. The tube and housing are preferably cooled by passive convection of oil and water, respectively.

As discussed above, the static magnetic field $B_0$ deflects the electron beam of the x-ray source unless the beam is positioned parallel to $B_0$. The present invention provides various additions to the x-ray source that steer the electron beam onto the anode target. The focal spot of an x-ray tube is characterized by the size and location of the focal spot on the target. Typical focal spot sizes for stationary anode x-ray tubes are on the order of 1 mm by 10 mm. In the present invention, the certainty about the location of the focal spot is improved over that which would occur in the presence of a misaligned main magnetic field (i.e., magnetic and electric fields that are not coaligned) when the additional steering provided by the present invention is not implemented. As a result of the present invention, the focal spot is located closer to the center of the x-ray tube.

Four embodiments of the x-ray source are provided to steer the beam toward the target, two of which are referred to as passive and two as active. The passive embodiments require no additional attention after the x-ray source is constructed and installed in the apparatus 30. The active embodiments require additional work after installation of the x-ray tube in the field, or during image acquisition, to steer the electron beam. Preferably, the x-ray tube is positioned so that its electron beam is substantially parallel to the static magnetic field, ie., so that the angle between the two is less than 15°, to minimize the work required to focus the electron beam on the target.

Note that because the magnetic force is perpendicular to the electron velocity, the electron moves in a spiral trajectory if the magnetic field is not identically parallel to the tube axis. Provided that the radius is small enough, the effect of the magnetic field is a broadening of the electron focal spot on the anode target. Some amount of broadening is acceptable, and therefore it is not necessary that the electrons travel in a perfectly straight line from cathode to anode.

Figure 4:
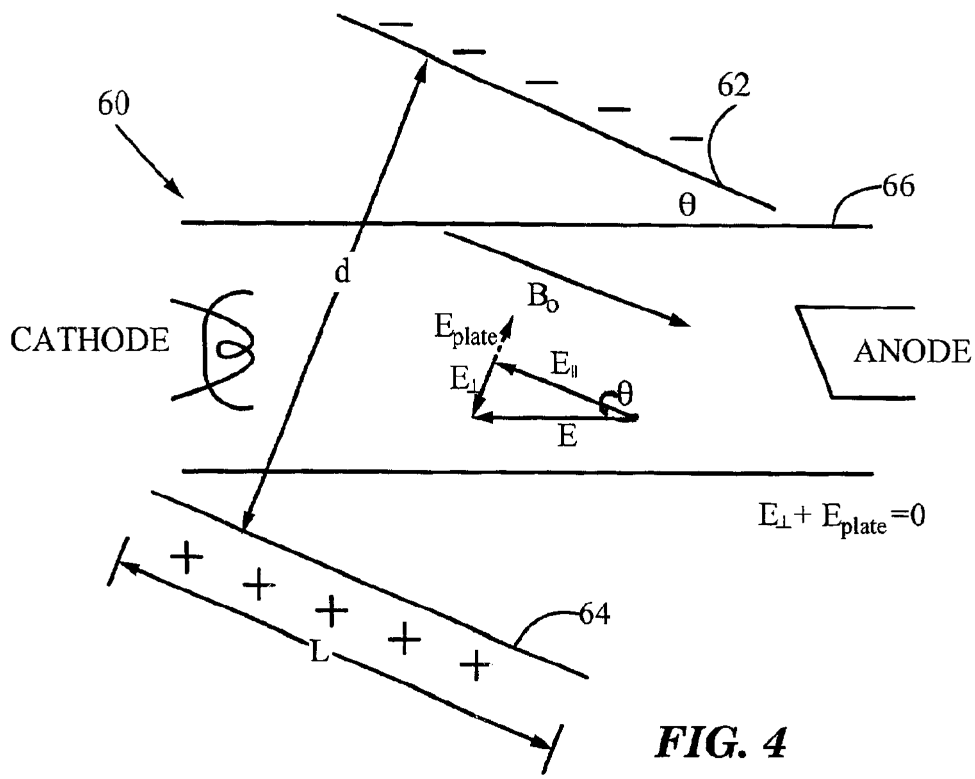
FIG. 4 is a schematic diagram of a first embodiment of an x-ray source of the apparatus of FIG. 3.

FIG. 4 shows a first embodiment of an x-ray source 60 of the invention, referred to as the electrostatic deflection embodiment. In the x-ray source 60, the electron beam is steered 30 using electrostatic plates 62 and 64 around an x-ray tube 66 and separated by a distance d. The plates 62 and 64 are parallel to each other and at an angle θ with the axis of the tube 66. θ is the angle between the main magnetic field $B_0$ and the electric field between the anode and cathode; that is, the plates 62 and 64 are parallel to $B_0$. An electric potential V is applied between the two plates, creating an approximately uniform electric field $E_{plate}$ of magnitude V/d within the tube. The electric field $E_{plate}$ exerts a force on an electron in the beam of magnitude $F_E$=eV/d, where e is the electron charge, directed toward the higher potential plate. The position of and electric potential between the plates 62 and 64 is selected to oppose the component of the main electric field E (between anode and cathode) that is perpendicular to the main $B_0$ field, $E_\perp$. The perpendicular force on the electrons is reduced to zero, as is the deflection of the electron beam in that direction.

Electrostatic deflection is a standard technique, and it will be apparent to those of average skill in the art how to implement the electrostatic deflection embodiment of the present invention using well-known methods and equipment. Appropriate power supplies and electronic components are provided to generate and control the required electric potentials.

It is desirable to be able to select the projection plane of the x-ray system, ranging from AP to lateral, during imaging. This is accomplished by mounting the x-ray source 60 and x-ray detector 44 on a rotatable support. The magnetic field is known or measurable at all locations within the system, and a controller is provided to determine and set the potential across the plates and to determine and set the angle of the plates relative to the axis of the x-ray tube, depending upon the relative positions of the x-ray tube and the magnetic field.

Figure 5:
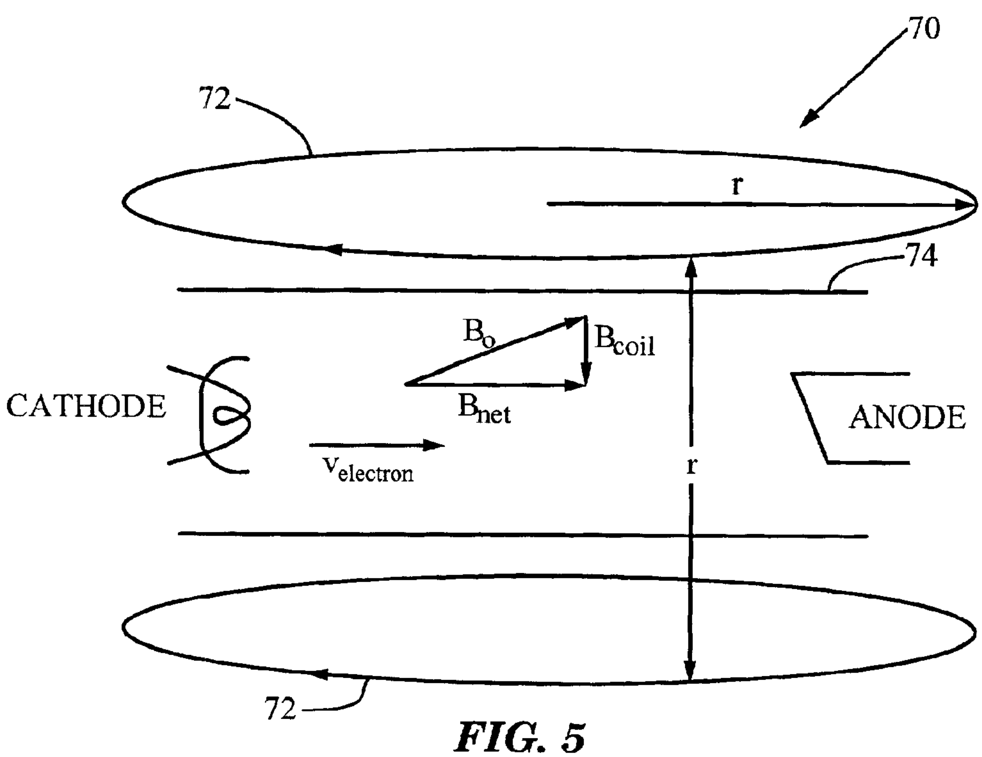
FIG. 5 is a schematic diagram of a second embodiment of an x-ray source of the apparatus of FIG. 3.

FIG. 5 shows a second embodiment of an x-ray source 70 of the present invention, referred to as the electromagnetic deflection embodiment. In this embodiment, the electron beam is steered toward the target using an electromagnet, coils 72 positioned around the outside of an x-ray tube 74. Each coil 72 contains N turns of wire, and the coils are separated by their radius r. Current flowing through the coils 72 generates an additional magnetic field $B_{coil}$ within the tube 74 that opposes the component of the static magnetic field perpendicular to the tube axis. Optimal focusing of the electron beam on the target is provided when the net magnetic field in the tube is directed along the tube axis, i.e., when the component of the magnetic field perpendicular to the tube axis is zero. In the electromagnetic deflection embodiment, the current I in the coils 72 is selected so that the sum of the coil magnetic field $B_{coil}$ and the static magnetic field $B_0$ is directed only along the tube axis. For example, as shown in FIG. 5, the coils 72 create a magnetic field $B_{coil}$ that adds to the static magnetic field $B_0$ to produce a net magnetic field $B_{net}$ within the tube parallel to the tube axis. Of course, the coils 72 only affect the magnetic field locally, i.e., in the tube. The current I is selected to provide the desired additional magnetic field $B_{coil}=8\mu_0 IN/(5^{3/2}r)$, where $\mu_0$ is the magnetic permeability of free space. The direction of the additional magnetic field can be reversed by reversing the direction of the current in the coils 72. Although only one coil is shown, a plurality of electromagnets can be used in this embodiment.

In this embodiment, a controller is provided to determine the required current to produce a net magnetic field aligned with the tube axis, depending upon the relative orientation of the tube and the static magnetic field and the magnitude of $B_0$. As with the electrostatic deflection embodiment, the x-ray system can be rotated to achieve the desired projection while maintaining the focus of the electron beam on the target.

The first and second embodiments require either a potential applied to the plates or current supplied to the coils during image acquisition, and are therefore referred to as active embodiments. As such, they also require a feedback system that allows appropriate choice of potential or current as a function of location of the focal spot on the anode of the x-ray tube. The feedback system consists of two components: the first part measures the location of the focal spot;

the second part uses the information obtained from the first part to modify the potential or current, thereby changing the location of the focal spot and providing dynamic steering.

The feedback process has three steps: 1) determine the location of the focal spot on the anode in the absence of the magnetic field; 2) determine the location of the focal spot in the presence of the magnetic field; and 3) steer the electron beam so that the focal spot is as close as possible to its location as measured in step 1. This process can be implemented prior to the acquisition of x-ray images (i.e., generating a table of potentials or currents that correspond to each location of the x-ray tube) if the x-ray tube is placed at reproducible locations within the magnetic field. Alternatively, the feedback process can be implemented during imaging if the x-ray tube is placed in arbitrary locations within the magnetic field.

The first component of the feedback system can be implemented using several different detection techniques. A first technique involves taking digital images of the focal spot using a pinhole geometry, and then determining the location of the focal spot using standard image processing algorithms. This technique can be used only if the tube is either not moved during image acquisition, or is moved to previously measured and characterized locations, since images of the focal spot cannot be obtained if another object is in the field of view of the x-ray system.

A second detection technique uses an array of low-resolution x-ray detectors (such as diodes) placed within or just outside of the x-ray tube (but not in the field of view of the imaging system) in order to monitor x-ray emissions at several locations around the anode. This array is referred to herein as a monitoring array. The monitoring array is then used to measure the emission profile of the anode in zero magnetic field, and compared with the emission profile obtained with the tube placed in the magnetic field and during adjustment of potential or current in the active embodiments.

A third detection technique uses two pairs of slits mounted within the x-ray tube so as to surround the electron beam. One pair is mounted vertically, and the other is mounted horizontally. Each border in each slit is adjustable so that it can be moved away from and toward the electron beam. In addition, each slit is connected through an ammeter to the cathode. When no magnetic field is present, the current flowing through the slits is measured, and the location of the slits is adjusted to ensure that the magnitude of the current flowing between the slits is small. When placed in a magnetic field, the potential or current of the active embodiments can then be adjusted until the magnitude of the current flowing between the slits is the same as was measured in the absence of a magnetic field.

A fourth technique uses an infrared sensor inside of the x-ray tube housing or inside of the x-ray tube itself to obtain images of the distribution of the heat on the anode. Again, automatic image processing techniques are used to determine the location of the focal spot in these images in the absence of and in the presence of the magnetic field.

The second component of the feedback system uses a standard controller to modify the current or potential as determined by the information acquired from the first component. It will be apparent to a person of average skill in the art how to implement such a controller.

The remaining embodiments for electron beam steering in the x-ray tube require no additional input during system operation and are therefore referred to as passive embodiments. The passive embodiments contain magnetic material in the x-ray source in a position that distorts the magnetic field in a desired manner. Specifically, the magnetic field is distorted locally to increase the focusing of the electron beam on the target. The passive embodiments are most useful when the electron beam is only slightly misaligned with the static magnetic field.

Figure 6:
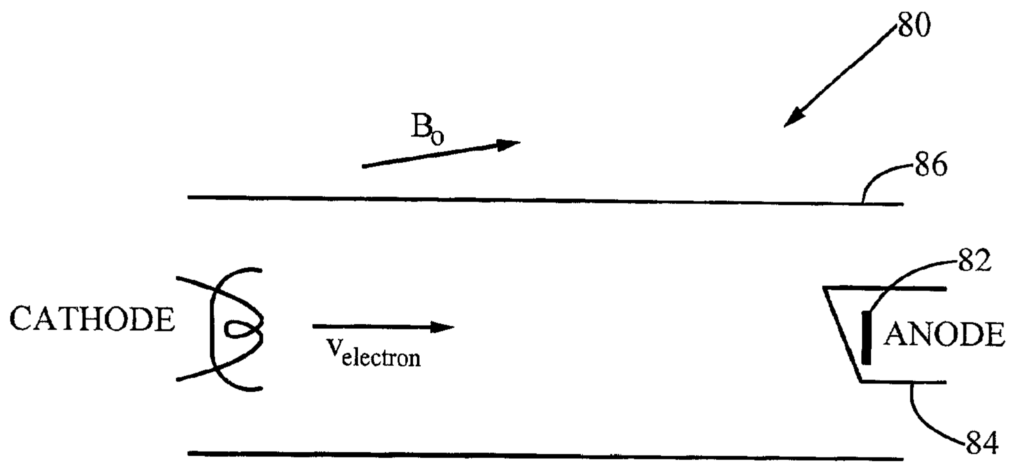
FIG. 6 is a schematic diagram of a third embodiment of an x-ray source of the apparatus of FIG. 3.

A third embodiment of an x-ray source 80 is shown in FIG. 6. In this embodiment, a small amount of magnetic material 82 is placed behind the anode 84 of the x-ray tube 86, i.e., on the side opposite the side on which the electrons collide with the target. Because the magnetic material 82 has a large magnetization in the applied magnetic field, it distorts the local magnetic field lines near the anode 84 so that more magnetic field lines go through the focal spot on the target. The locally distorted magnetic field acts to increase the focusing of the electrons on the anode target. Any suitable magnetic material can be used.

Figure 7:
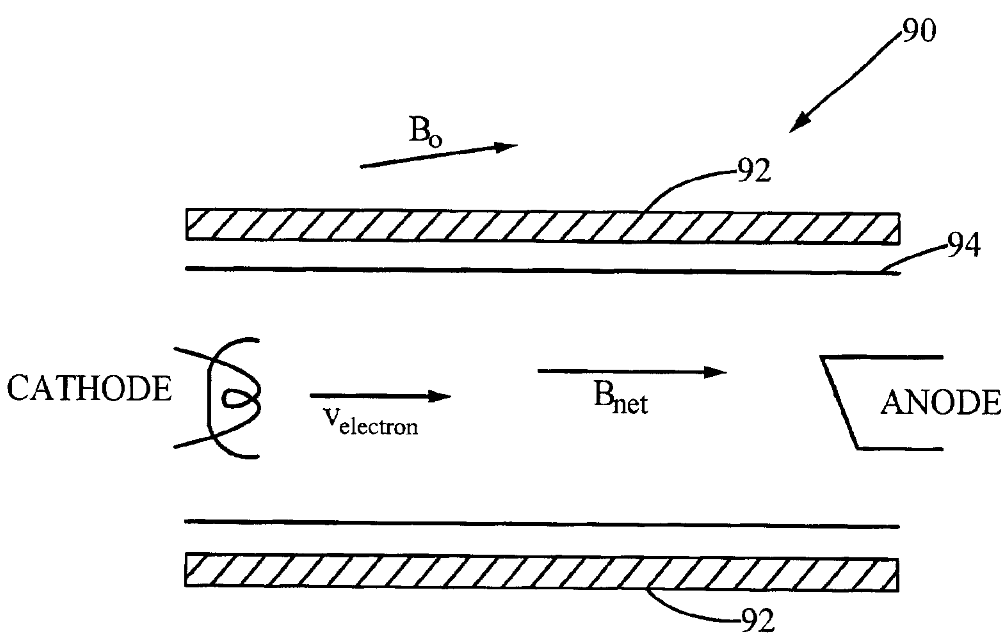
FIG. 7 is a schematic diagram of a fourth embodiment of an x-ray source of the apparatus of FIG. 3.

A fourth embodiment of an x-ray source 90 is shown in FIG. 7. An envelope 92 of magnetic material is placed around an x-ray tube 94. For example, as shown, the envelope 92 can be a cylindrical tube of an alloy with a small amount of iron. However, the envelope 92 need only have an axis of symmetry through the center of the x-ray tube 94; it can have square, circular, elliptical, or other cross sections, and the size of the cross section (radius, width, etc.) can vary along the length of the tube. In a magnetic field, the magnetic material of the envelope 92 is highly magnetized and distorts the magnetic field locally, i.e., inside the x-ray tube 94. It is known that a magnetic tube can be used to shield its interior from static magnetic fields. In the present invention, the envelope 92 acts to align the net magnetic field inside the tube with the axis of the x-ray tube, thereby decreasing the deflection of the electron beam and increasing its focusing on the anode.

According to an imaging method of the invention, magnetic resonance images and x-ray fluoroscopic images are acquired of an object within coincident MR and x-ray fields of view. X-ray images are acquired using an x-ray tube for generating x-rays by accelerating an electron beam between a cathode and an anode. The electron beam is steered according to one of four embodiments in order to increase its focusing on the target of the x-ray tube. In one embodiment, the beam is electrostatically deflected using electrostatic plates. In a second embodiment, the beam is electromagnetically deflected using an electromagnet adjacent to or surrounding the tube. In a third embodiment, the beam is deflected by positioning a magnetic material adjacent to the x-ray tube anode, on a side opposite the electron beam. In a fourth embodiment, the beam is deflected by positioning an axially symmetric magnetic envelope around the x-ray tube.

In summary, the present invention provides a combination of a MRI system and x-ray fluoroscopy system incorporating an x-ray tube according to one of the four embodiments discussed above. Deflection of the electron beam by the static magnetic field is reduced, so that small, centrally located focal spots on the anode target are obtained. Thus the invention enables high quality MR images and x-ray fluoroscopic images to be acquired with minimal motion of the imaged object. This is particularly advantageous for interventional procedures in which x-ray imaging guides device placement while MR imaging is used to monitor the physiological consequences and provide three-dimensional imaging.

It will be clear to one skilled in the art that the above embodiments may be altered in many ways without departing from the scope of the invention. Accordingly, the scope of the invention should be determined by the following claims and their legal equivalents.

What is claimed is:

1. An imaging system comprising:

a) a magnetic resonance imaging (MRI) system having a MRI field of view (FOV) and comprising a magnet for generating a static magnetic field; and b) an x-ray imaging system having an x-ray field of view (FOV) and comprising an x-ray source in the presence of said static magnetic field, said x-ray source comprising:

an x-ray tube for generating x-rays, said x-ray tube having an anode and functioning by accelerating an electron beam onto an anode target; and means for steering said electron beam onto said anode target; and c) a feedback system in communication with said means for steering said electron beam, wherein said feedback system comprises means for measuring a location of a focal spot of said electron beam on said anode target.

2. The imaging system of claim 1 wherein said MRI FOV and said x-ray FOV are substantially coincident.

3. The imaging system of claim 1 wherein said means for steering said electron beam comprises electrostatic plates.

4. The imaging system of claim 3 wherein said means for steering said electron beam further comprises a controller for setting an electric potential of said electrostatic plates in dependence on said static magnetic field.

5. The imaging system of claim 1 wherein said means for steering said electron beam comprises at least one electromagnet adjacent to said x-ray tube.

6. The imaging system of claim 5 wherein said means for steering said electron beam further comprises a controller for setting a current in said electromagnet in dependence on said static magnetic field.

7. The imaging system of claim 1 wherein said means for steering said electron beam comprises a magnetic material.

8. The imaging system of claim 7 wherein said magnetic material is adjacent to said anode on a side opposite said electron beam.

9. The imaging system of claim 7 wherein said magnetic material is an envelope of magnetic material around said x-ray tube.

10. The imaging system of claim 1 wherein said means for measuring said location of said focal spot comprises a digital imager.

11. The imaging system of claim 1 wherein said means for measuring said location of said focal spot comprises a monitoring array adjacent to said anode for measuring an x-ray emission profile of said anode target.

12. The imaging system of claim 1 wherein said means for measuring said location of said focal spot comprises slits surrounding said electron beam for measuring a current through said slits.

13. The imaging system of claim 1 wherein said means for measuring said location of said focal spot comprises an infrared sensor adjacent to said anode for measuring a heat distribution of said anode.

14. The imaging system of claim 1 wherein said x-ray tube is positioned so that said electron beam is substantially parallel to said static magnetic field.

15. The imaging system of claim 1 wherein said x-ray imaging system comprises components, at least some of said components being non-magnetic, whereby said static magnetic field is not substantially disturbed by said x-ray imaging system.

16. An imaging method comprising:

acquiring a magnetic resonance image of an object located within a field of view (FOV) of a magnetic resonance imaging (MRI) system; and acquiring an x-ray image of said object within a FOV of an x-ray imaging system having an x-ray tube in the presence of a static magnetic field of said MRI system, comprising generating x-rays by accelerating an electron beam onto an anode target of said x-ray tube and steering said electron beam toward a focal spot on said anode target, wherein the steering reduces a deflection of said electron beam by said static magnetic field of said MRI system.

17. The imaging method of claim 16 wherein said MRI FOV and said x-ray FOV are substantially coincident.

18. The imaging method of claim 16 wherein steering said electron beam comprises electrostatically deflecting said electron beam using electrostatic plates.

19. The imaging method of claim 16 wherein steering said electron beam comprises electromagnetically deflecting said electron beam using at least one electromagnet adjacent to said x-ray tube.

20. The imaging method of claim 16 wherein steering said electron beam comprises positioning a magnetic material adjacent to said electron beam.

21. The imaging method of claim 20 wherein said magnetic material is positioned adjacent to said anode on a side opposite said electron beam.

22. The medical imaging method of claim 20 wherein said magnetic material is an envelope of magnetic material positioned around said x-ray tube.

* * * * *